United States Patent
Tan et al.

(10) Patent No.: US 7,462,942 B2
(45) Date of Patent: Dec. 9, 2008

(54) DIE PILLAR STRUCTURES AND A METHOD OF THEIR FORMATION

(75) Inventors: Kim Hwee Tan, Singapore (SG); Ch'ng Han Shen, Singapore (SG); Rosemarie Tagapulot, Singapore (SG); Yin Yen Bong, Melaka (MY); Ma L. Nang Htoi, Singapore (SG); Lim Tiong Soon, Singapore (SG); Shikui Lui, Singapore (SG); Balasubramanian Sivagnanam, Singapore (SG)

(73) Assignee: Advanpack Solutions Pte Ltd, Singapore (SG)

( * ) Notice: Subject to any disclaimer, the term of this patent is extended or adjusted under 35 U.S.C. 154(b) by 0 days.

(21) Appl. No.: 10/682,054

(22) Filed: Oct. 9, 2003

(65) Prior Publication Data

US 2005/0077624 A1    Apr. 14, 2005

(51) Int. Cl.
*H01L 29/40* (2006.01)
*H01L 21/44* (2006.01)

(52) U.S. Cl. ............... 257/782; 257/734; 257/737; 257/738; 257/780; 257/783; 257/E23.021; 438/612; 438/613; 438/614; 438/652; 438/654; 438/660; 438/666; 438/687; 438/688

(58) Field of Classification Search ............... 257/734, 257/737, 738, 780, 782, 783, E23.021; 438/612, 438/613, 614, 652, 654, 660, 666, 687, 688
See application file for complete search history.

(56) References Cited

U.S. PATENT DOCUMENTS

| | | | |
|---|---|---|---|
| 4,430,690 A | | 2/1984 | Chance et al. |
| 5,251,806 A | * | 10/1993 | Agarwala et al. ...... 228/180.22 |
| 5,448,114 A | | 9/1995 | Kondoh et al. |
| 6,297,581 B1 | | 10/2001 | Dudderar et al. |
| 6,550,666 B2 | | 4/2003 | Chew et al. |
| 6,642,136 B1 | * | 11/2003 | Lee et al. .................... 438/613 |
| 6,847,066 B2 | | 1/2005 | Tahara et al. |

FOREIGN PATENT DOCUMENTS

| JP | 2000243765 | 9/2000 |
|---|---|---|
| JP | 2000243783 | 9/2000 |

OTHER PUBLICATIONS

"Advanced Connections," Spring 2002, Advanced Interconnect Technologies, pp. 1-8.

* cited by examiner

*Primary Examiner*—Thanh V Pham
(74) *Attorney, Agent, or Firm*—Saile Ackerman LLC; Stephen B. Ackerman; Stephen G. Stanton

(57) ABSTRACT

A die, comprising a substrate and one or more pillar structures formed over the substrate in a pattern and the method of forming the die.

59 Claims, 5 Drawing Sheets

DIE PILLAR STRUCTURES AND A METHOD OF THEIR FORMATION

FIELD OF THE INVENTION

The present invention relates generally to fabrication of semiconductor chip interconnection, and more specifically to bump fabrication.

BACKGROUND OF THE INVENTION

In a growing market demand to improve existing semiconductor device performance on power devices, that is devices that consume a lot of energy such as amplifiers.

Current round or round-like (such as hexagonal or octagonal) solder bump interconnects have become a bottleneck to improve electrical performance to address current flow to the chip level and heat dissipation capability down to the PCB. For example, the "Advanced Connections," Spring 2002, Advanced Interconnect Technologies, issue describes, inter alia, a pillar bumping interconnect technology that uses perimeter or array flip-chip pads to connect an integrated circuit (IC) to a copper lead frame.

U.S. Pat. No. 6,550,666 B2 to Chew et al. discloses a method for forming a flip chip on leadframe semiconductor package.

U.S. Pat. No. 5,448,114 to Kondoh et al. discloses a semiconductor flip chip packaging having a perimeter wall.

U.S. Pat. No. 6,297,551 B1 discloses integrated circuit packages with improved EMI characteristics.

U.S. Pat. No. 4,430,690 to Chance et al. discloses a low inductance capacitor with metal impregnation and solder bar contact.

SUMMARY OF THE INVENTION

Accordingly, it is an object of the present invention to provide a improved bump design.

Other objects will appear hereinafter.

It has now been discovered that the above and other objects of the present invention may be accomplished in the following manner. Specifically, a die comprises a substrate and one or more pillar structures formed over the substrate in a pattern. The invention also includes the formation of a die by providing a substrate and forming one or more pillar structures over the substrate in a pattern.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Initial Structure

Figure 1:
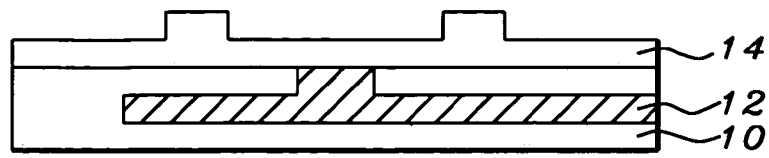
FIGS. 1 to 7 schematically illustrate a preferred embodiment of the method of forming the pillar structures of the present invention.

As shown in FIG. 1, structure 10 includes at least one embedded metal structure 12 and an overlying dielectric layer 14.

Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Embedded metal structure 12 may be electrically connected to one or more semiconductor devices formed within structure 10 and is preferably comprised of aluminum (Al), copper (Cu) or gold (Au) and is more preferably aluminum (Al) as will be used for illustrative purposes hereafter.

Overlying dielectric layer 14 is preferably comprised of nitride, silicon nitride ($Si_3N_4$), silicon oxide ($SiO_2$) or polyimide and is more preferably silicon nitride as will be used for illustrative purposes hereafter.

The structure of FIG. 1 may be cleaned as necessary.

Figure 2:
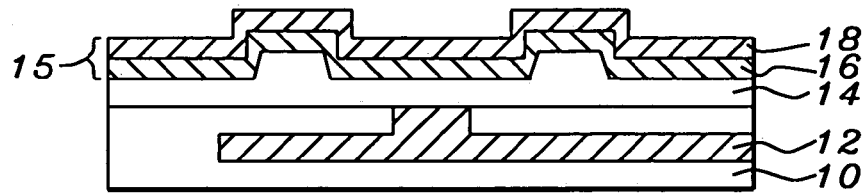

Formation of Metal Layer 15—FIG. 2

As shown in FIG. 2, a metal layer 15 is formed over the SiN layer 14. Metal layer 15 is preferably formed by sputtering.

Metal layer 15 is formed/spread over the whole of the wafer surface. Metal layer 15 preferably comprises a lower metal layer 16 and an upper metal layer 18. Lower metal layer 16 may be a metal barrier layer and is preferably titanium (Ti) or TiW and is more preferably Ti. Upper metal layer 18 is preferably copper (Cu).

Figure 3:
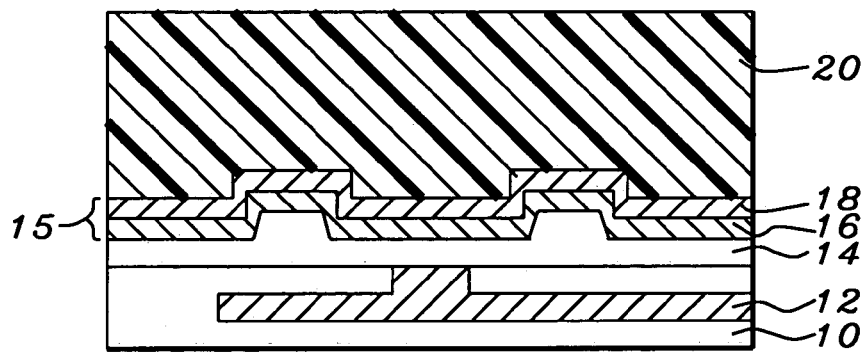

Formation of Masking Layer 20—FIG. 3

As shown in FIG. 3, a masking layer 20 is formed over metal layer 15.

Masking layer 20 is preferably comprised of photoresist.

Figure 4:
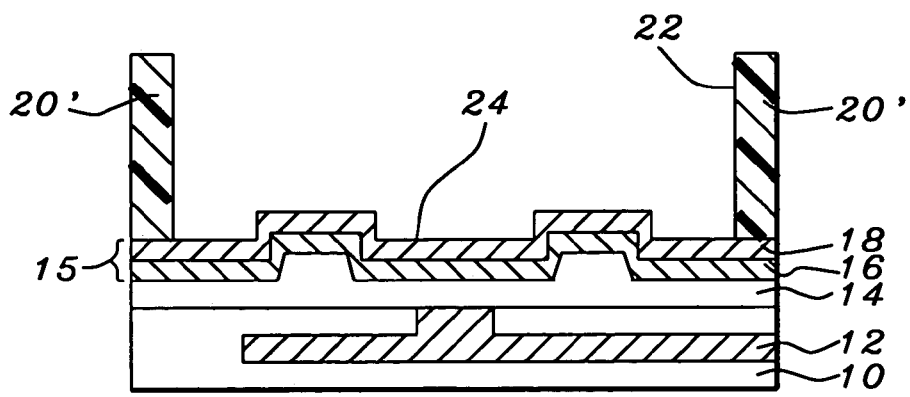

Patterning of Photoresist Layer 20—FIG. 4

As shown in FIG. 4, photoresist layer 20 is then patterned to form patterned photoresist layer 20' having an opening 22 exposing a portion 24 of Cu layer 18. Opening 22 is formed in the shape selected to become the shape of the pillar structure 34. For example, as shown in the FIGS., opening 22 is rectangular but may also be round, ring-shaped, bar-shaped or spline as well as other shapes.

Figure 5:
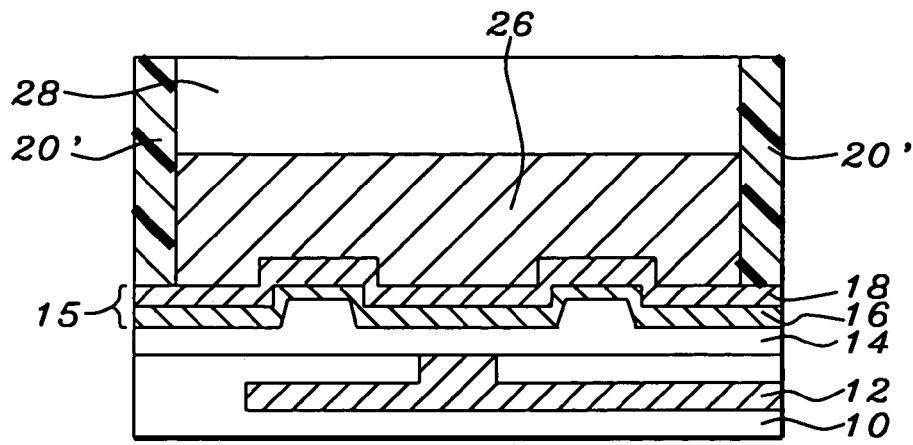

Plating of Metal Layer 26 Within Opening 22—FIG. 5

As shown in FIG. 5, a pillar metal layer 26 is formed over the exposed portion 24 of Cu layer 18 within opening 22 to a thickness of preferably from about 60 to 120 μm and more preferably from about 70 to 100 μm. Pillar metal layer 26 is preferably formed by plating. Pillar metal layer 26 will be in the shape selected for the pillar structure 34, for example rectangular as specifically illustrated in the FIGS. or round, ring-shaped, bar-shaped, wall-like or spline or other shapes.

Pillar metal layer 26 is lead-free and is preferably comprised of copper (Cu).

The pillar metal layer 26 may be coated with, for example, oxide or another material such as chromium, nickel, etc.

An optional layer of solder 28 is formed/plated over Cu pillar layer 26. Optional solder layer 28 may be roughly flush with the top surface of the patterned photoresist layer 20' and may be overplated to preferably up to about 5 μm. Solder layer 28 is preferably comprised of: (1) from about 60 to 70% tin and from about 30 to 40% lead (Pb) for eutectic; (2) about 63% tin and 37% lead (Pb) for eutectic; (3) from about 99 to 100% tin and Sn3.5Ag for lead-free; or (4) 100% tin for lead-free and more preferably (2) about 63% tin and 37% lead (Pb) for eutectic or (4) 100% tin for lead-free.

Figure 6:
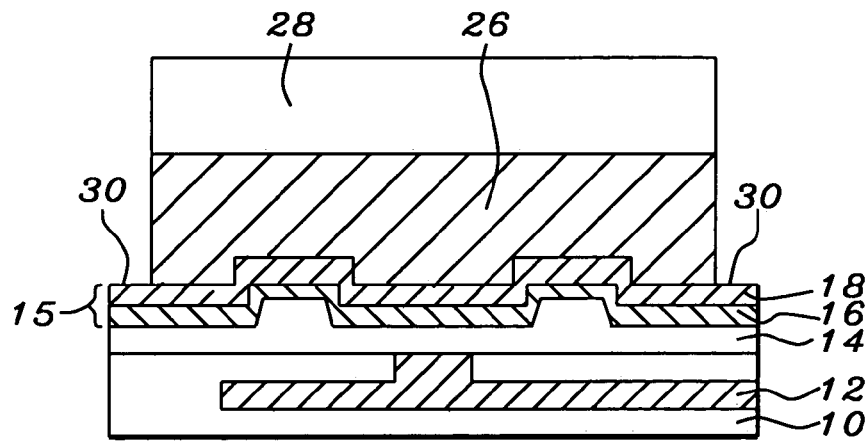

Removal of Patterned Mask Layer 20'—FIG. 6

As shown in FIG. 6, the remaining patterned mask/photoresist layer 20' is removed from the structure of FIG. 5, preferably by stripping, to expose portions 30 of Cu layer 15 outboard of Cu pillar layer/solder layer 26/28.

Figure 7:
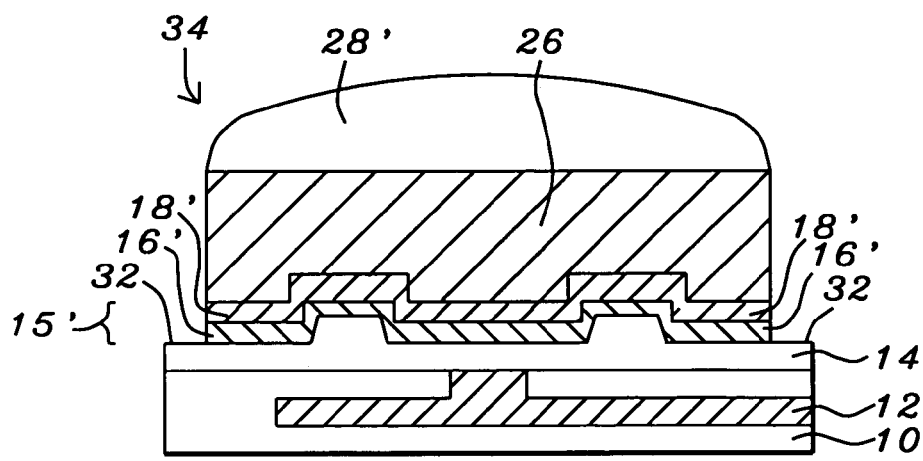

Etching of Exposed Portions 30 of Cu Layer 15—FIG. 7

As shown in FIG. 7, the exposed portions 30 of Cu layer 15 outboard of Cu pillar layer/solder layer 26/28 are removed, preferably by etching, to expose portions 32 of overlying SiN layer 14 outboard of Cu pillar layer/solder layer 26/28.

Reflow of Copper Pillar Layer/Solder Layer 26/28—FIG. 7

Also as shown in FIG. 7, the wafer is subject to reflow so that the optional solder/cap layer 28 is reflowed to form pillar structure 34 of the present invention. The copper pillar layer 26 does not melt at the reflow temperature of the solder cap 28 or lead-free solder cap 28. The cap 28 is the portion that bonds the die/CSP with the substrate/leadframe/PCB.

The total height of the pillar structure 34 after reflow is preferably from about 60 to 150 µm and more preferably about 100 µm.

Solder 28' of pillar structure 34 provides a seal over the top of the Cu pillar layer 26 while it's sides are exposed.

It is noted that the bump can be at variable heights within the die.

The pillar structures 34 are used to connect die to die, die to leadframe and/or die to substrate.

Figure 8:
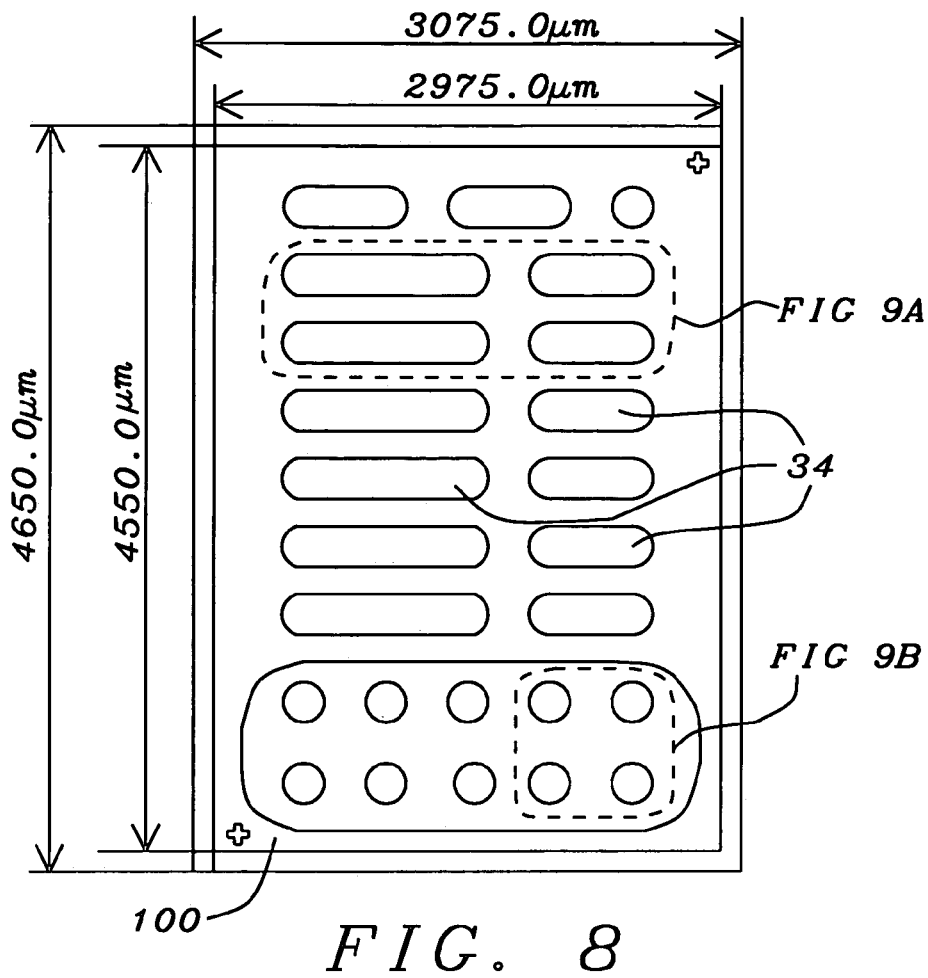
FIG. 8 is a top down schematic view of a die on a wafer having the pillar structures of the present invention.

Example Die Design 100—FIGS. 8 and 9

FIG. 8 illustrates an example die design 100 employing a design of the pillar structures 34 of the present invention surrounded by the die perimeter. As shown in FIG. 8, the die 100 may include pillar structures/bumps 34 of varying shapes.

The die perimeter may be used, and provides RF shielding, in Surface Acoustic Wave (SAW) devices, noise reduction, power current capacity, hermetic shield and may be used in RF devices, power devices and MEMs for noise isolation and current capacity.

Figure 9A:
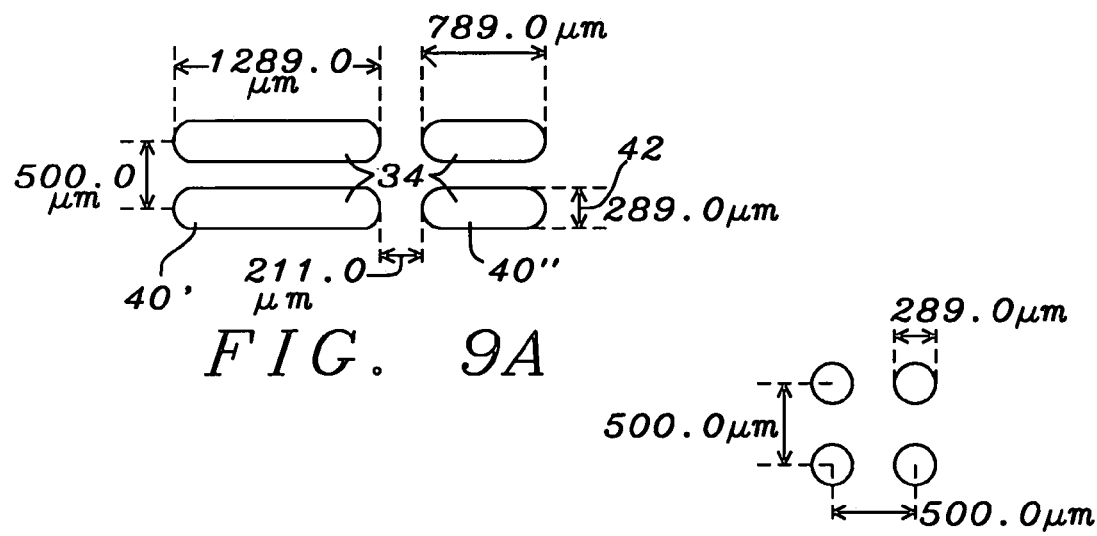
FIGS. 9A and 9B are respective portions of FIG. 8 in dashed circles "9A" and "9B."
Figure 9B:
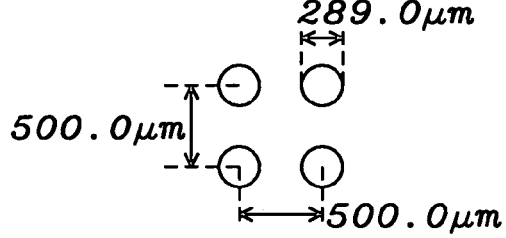

FIGS. 9A and 9B are the respective portions of FIG. 8 in dashed circles "9A" and "9B." FIG. 9A illustrates example pillar structure 34 widths, lengths and spacing for rectangular shaped pillar structures 34. As shown in FIG. 9A, the pillar structures 34 of the present invention may be roughly rectangular and have a: width 42 of preferably about 289.0 µm; respective lengths 40', 40" of preferably about 789.0 µm or about 1289.0 µm; be spaced apart lengthwise about 500.0 µm center-to-center and be spaced apart about 211.0 µm end-to-end. As shown in FIG. 9B, pillar structures 34 may be round shaped having a diameter of about 289.0 µm and be spaced apart about 500.0 µm.

Figure 10A:
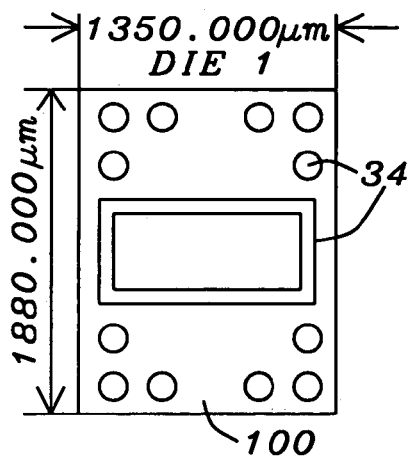
FIGS. 10A to 10I are top down schematic views of additional dies with varying pillar structures/bumps designs/shapes.
Figure 10B:
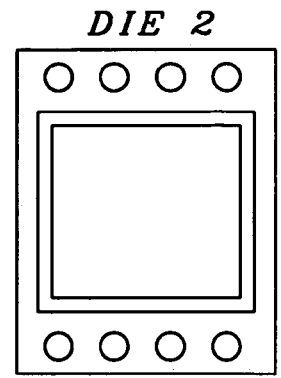
Figure 10C:
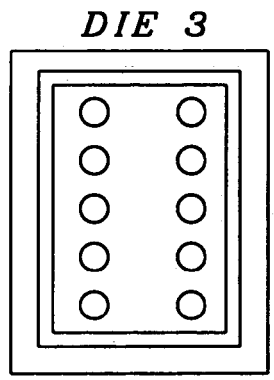
Figure 10D:
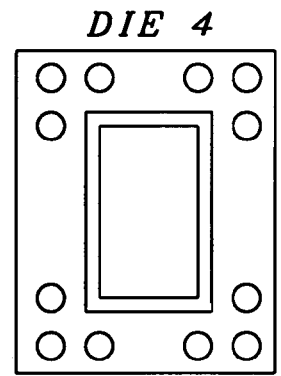
Figure 10E:
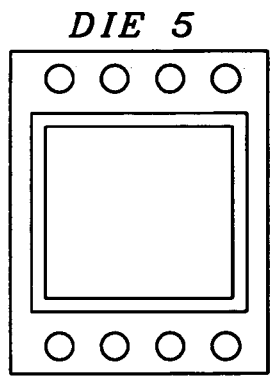
Figure 10F:
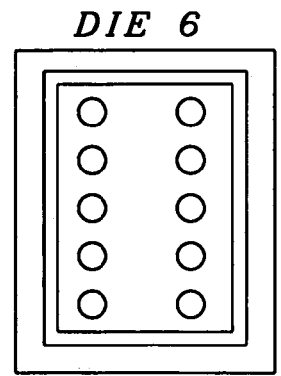
Figure 10G:
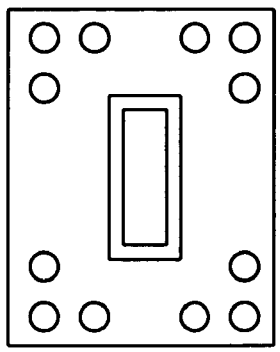
Figure 10H:
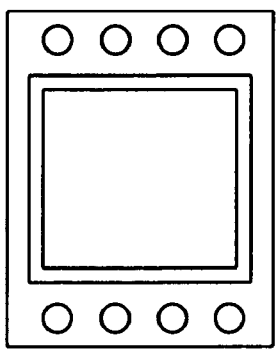
Figure 10I:
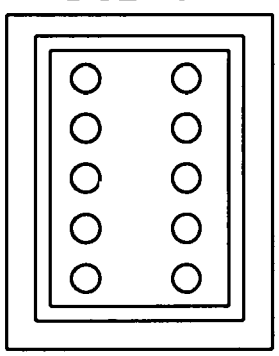

FIGS. 10A to 10J illustrate dies 100' having other permissible pillar structure/bump 34 shapes and designs. For example, as shown in FIG. 10D pillar structure/bump 34 may be circular and may also be a square wall-like structure 34 as shown in the center of the die 100'.

The pillar structures of the present invention may be used in Surface Acoustic Wave (SAW) devices and power switches, for example, as well as MEMs.

Advantages of the Invention

The advantages of one or more embodiments of the present invention include:

1) the pillar structures of the present invention can conduct a higher flow of current;

2) better board level reliability performance with the use of the pillar structures of the present invention;

3) C4 (control collapse chip connect) feature of the pillar structures maintain required stand-off between the die and the package;

4) the pillar structures of the present invention provide improved heat dissipation; and 5) bigger area of metal/copper in a given pad opening provides better reliability.

While particular embodiments of the present invention have been illustrated and described, it is not intended to limit the invention, except as defined by the following claims.

We claim:

1. A die, comprising:
a substrate; and
two or more different types of pillar structures formed over the substrate in a pattern; at least one of the two or more different types of pillar structures includes a lower high-melting-point non-solder portion and an upper solder material portion over and in substantial contact with only an upper surface of the lower high-melting point non-solder portion; and only a lead-free metal portion interposed between the substrate and the at least one pillar structure; wherein the lower high-melting-point non-solder portion does not melt during a reflow process to form the two or more different types of pillar structures.

2. The die of claim 1, wherein at least one of the two or more different types of pillar structures has a rectangular shape, a round shape, a ring shape, a wall-like shape or a spline shape.

3. The die of claim 1, wherein at least one of the two or more different types of pillar structures has a rectangular shape with a length of from about 789.0 to 1289.0 µm and a width of about 289.0 µm.

4. The die of claim 1, wherein at least one of the two or more different types of pillar structures has a rectangular shape with a length of about 789.0 µm and a width of about 289.0 µm.

5. The die of claim 1, wherein at least one of the two or more different types of pillar structures has a rectangular shape with a length of about 1289.0 µm and a width of about 289.0 µm.

6. The die of claim 1, wherein at least one of the two or more different types of pillar structures has a rectangular shape and the two or more different types of pillar structures are spaced apart lengthwise by about 500.0 µm center-to-center and by about 211.0 µm end-to-end.

7. The die of claim 1, wherein at least one of the two or more different types of pillar structures has a round shape with a diameter of about 289.0µm.

8. The die of claim 1, wherein at least one of the two or more different types of pillar structures has a round shape with a diameter of about 289.0µm; the two or more different types of pillar structures being arranged at least in part in rows and columns with the adjacent round pillar structures being spaced apart by about 500.0 µm.

9. The die of claim 1, wherein the pillar structure pattern includes a series of rows and columns.

10. The die of claim 1, wherein the pillar structure pattern includes a series of rows and columns; the pillar structures arranged in the series of rows and columns are spaced apart lengthwise by about 500.0 μm center-to-center in the columns and are spaced apart about 211.0 μm end-to-end.

11. The die of claim 1, wherein at least one of the two or more different types of pillar structures includes at least one wall-shaped pillar structure.

12. The die of claim 1, wherein at least one of the two or more different types of pillar structures includes at least one wall-shaped pillar structure forming a square.

13. The die of claim 1, including a pillar wall.

14. The die of claim 1, wherein the lower high-melting-point non-solder portion is comprised of copper coated with oxide, chromium or nickel.

15. The die of claim 1, wherein the upper solder material portion is comprised of:
from about 60 to 70% tin and from about 30 to 40% lead;
about 63% tin and 37% lead;
about 99% tin and SnAg; or
100%tin.

16. The die of claim 1, wherein the solder material portion is comprised of:
about 63% tin and 37% lead; or
100%tin.

17. The die of claim 1, wherein the pillar structures each have a total height of from about 60 to 150 μm.

18. The die of claim 1, wherein the pillar structures each have a total height of about 100 μm.

19. The die of claim 1, wherein the die is used in Surface Acoustic Wave devices and in MEM devices.

20. The method of claim 1, wherein the lower high-melting-point non-solder portion is comprised of copper.

21. A die, comprising:
a substrate; and
two or more different types of pillar structures formed over the substrate in a pattern; the two or more different types of pillar structures having a rectangular shape, a round shape, a ring shape, a wall-like shape or a spline shape; at least one of the two or more different types of pillar structures includes a lower high-melting-point non-solder portion and an upper solder material portion over and in substantial contact with only an upper surface of the lower high-melting point non-solder portion; and only a lead-free metal portion interposed between the substrate and the at least one pillar structure; wherein the lower high-melting-point non-solder portion does not melt during a reflow process to form the two or more different types of pillar structures.

22. The die of claim 21, wherein at least one of the two or more different types of pillar structures has a rectangular shape with a length of from about 789.0 to 1289.0 μm and a width of about 289.0 μm.

23. The die of claim 21, wherein at least one of the two or more different types of pillar structures has a rectangular shape with a length of about 789.0 μm and a width of about 289.0 μm.

24. The die of claim 21, wherein at least one of the two or more different types of pillar structures has a rectangular shape with a length of about 1289.0 μm and a width of about 289.0 μm.

25. The die of claim 21, wherein at least one of the two or more different types of pillar structures has a rectangular shape and the two or more different types of pillar structures are spaced apart lengthwise by about 500.0 μm center-to-center and by about 211.0 μm end-to-end.

26. The die of claim 21, wherein at least one of the two or more different types of pillar structures has a round shape with a diameter of about 289.0 μm.

27. The die of claim 21, wherein at least one of the two or more different types of pillar structures has a round shape with a diameter of about 289.0 μm; the two or more different types of pillar structures being arranged at least in part in rows and columns with the adjacent round pillar structures being spaced apart by about 500.0 μm.

28. The die of claim 21, wherein the pillar structure pattern includes a series of rows and columns.

29. The die of claim 21, wherein the pillar structure pattern includes a series of rows and columns; the pillar structures arranged in the series of rows and columns are spaced apart lengthwise by about 500.0 μm center-to-center in the columns and are spaced apart about 211.0 μm end-to-end.

30. The die of claim 21, wherein the two or more different types of pillar structures include at least one wall-shaped pillar structure.

31. The die of claim 21, wherein the two or more different types of pillar structures include at least one wall-shaped pillar structure forming a square.

32. The die of claim 21, including a pillar wall.

33. The die of claim 21, wherein the lower high-melting-point non-solder portion is comprised of copper coated with oxide, chromium or nickel.

34. The die of claim 21, wherein the upper solder material portion is comprised of:
from about 60 to 70% tin and from about 30 to 40% lead;
about 63% tin and 37% lead;
about 99% tin and SnAg; or
100% tin.

35. The die of claim 21, wherein the upper solder material portion is comprised of:
about 63% tin and 37% lead; or
100% tin.

36. The die of claim 21, wherein the pillar structures each have a total height of from about 60 to 150 μm.

37. The die of claim 21, wherein the pillar structures each have a total height of about 100 μm.

38. The die of claim 21, wherein the die is used in Surface Acoustic Wave devices and in MEM devices.

39. The method of claim 21, wherein the lower high-melting-point non-solder portion is comprised of copper.

40. A method of forming a die, comprising the steps:
providing a substrate; and
forming two or more different types of pillar structures over the substrate in a pattern; at least one of the two or more different types of pillar structures includes a lower high-melting-point non-solder portion and an upper solder material portion over and in substantial contact with only an upper surface of the lower high-melting point non-solder portion; and only a lead-free metal portion interposed between the substrate and the at least one pillar structure; wherein the lower high-melting-point non-solder portion does not melt during a reflow process to form the two or more different types of pillar structures.

41. The method of claim 40, wherein at least one of the two or more different types of pillar structures has a rectangular shape, a round shape, a ring shape, a wall-like shape or a spline shape.

42. The method of claim 40, wherein at least one of the two or more different types of pillar structures has a rectangular shape with a length of from about 789.0 to 1289.0 μm and a width of about 289.0 μm.

43. The method of claim 40, wherein at least one of the two or more different types of pillar structures has a rectangular shape with a length of about 789.0 μm and a width of about 289.0 μm.

44. The method of claim 40, wherein at least one of the two or more different types of pillar structures has a rectangular shape with a length of about 1289.0 μm and a width of about 289.0 μm.

45. The method of claim 40, wherein at least one of the two or more different types of pillar structures has a rectangular shape and the two or more different types of pillar structures are spaced apart lengthwise by about 500.0 μm center-to-center and by about 211.0 μm end-to-end.

46. The method of claim 40, wherein at least one of the two or more different types of pillar structures has a round shape with a diameter of about 289.0 μm.

47. The method of claim 40, wherein at least one of the two or more different types of pillar structures has a round shape with a diameter of about 289.0 μm; the two or more different types of pillar structures being arranged at least in part in rows and columns with the adjacent round pillar structures being spaced apart by about 500.0 μm.

48. The method of claim 40, wherein the pillar structure pattern includes a series of rows and columns.

49. The method of claim 40, wherein the pillar structure pattern includes a series of rows and columns; the pillar structures arranged in the series of rows and columns are spaced apart lengthwise by about 500.0 μm center-to-center in the columns and are spaced apart about 211.0 μm end-to-end.

50. The method of claim 40, wherein at least one of the two or more different types of pillar structures includes at least one wall-shaped pillar structure.

51. The method of claim 40, wherein at least one of the two or more different types of pillar structures includes at least one wall-shaped pillar structure forming a square.

52. The method of claim 40, including a pillar wall.

53. The method of claim 40, wherein the lower high-melting-point non-solder portion is comprised of copper coated with oxide, chromium or nickel.

54. The method of claim 40, wherein the upper solder material portion is comprised of:
from about 60 to 70% tin and from about 30 to 40% lead;
about 63% tin and 37% lead;
about 99% tin and SnAg; or
100% tin.

55. The method of claim 40, wherein the upper solder material portion is comprised of:
about 63% tin and 37% lead; or
100% tin.

56. The method of claim 40, wherein the pillar structures each have a total height of from about 60 to 150 μm.

57. The method of claim 40, wherein the pillar structures each have a total height of about 100 μm.

58. The method of claim 40, wherein the die formed is used in Surface Acoustic Wave devices and in MEM devices.

59. The method of claim 40, wherein the lower high-melting-point non-solder portion is comprised of copper.

\* \* \* \* \*